(12) United States Patent
Falk et al.

(10) Patent No.: US 11,322,684 B2
(45) Date of Patent: May 3, 2022

(54) ELECTRICALLY ROTATABLE ANTENNAS FORMED FROM AN OPTICALLY TUNABLE MATERIAL

(71) Applicant: International Business Machines Corporation, Armonk, NY (US)

(72) Inventors: Abram L. Falk, Port Chester, NY (US); Jessie Carrigan Rosenberg, Mount Vernon, NY (US); Damon Brooks Farmer, White Plains, NY (US); Kafai Lai, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 16/541,866

(22) Filed: Aug. 15, 2019

(65) Prior Publication Data

US 2021/0050515 A1    Feb. 18, 2021

(51) Int. Cl.
    *H01L 45/00*    (2006.01)
    *H01Q 3/44*    (2006.01)
    (Continued)

(52) U.S. Cl.
    CPC ...... *H01L 45/1213* (2013.01); *H01L 27/2472* (2013.01); *H01L 45/06* (2013.01);
    (Continued)

(58) Field of Classification Search
    CPC .................................................. H01L 45/1213
    See application file for complete search history.

(56) References Cited

U.S. PATENT DOCUMENTS 6,111,542 A    8/2000 Day et al.
6,700,550 B2    3/2004 Crowley
(Continued)

FOREIGN PATENT DOCUMENTS

WO    9947983 A1    9/1999

OTHER PUBLICATIONS

L.M. De La Cruz et al., "Germanium Telluride Reconfigurable Antennas," International Symposium on Antennas and Propagation (APSURSI), Jun. 26-Jul. 1, 2016, pp. 1053-1054.
(Continued)

*Primary Examiner* — Moazzam Hossain
*Assistant Examiner* — Hajar Kolahdouzan
(74) *Attorney, Agent, or Firm* — Stosch Sabo; Ryan, Mason & Lewis, LLP

(57) ABSTRACT

An apparatus includes two or more electrically rotatable antennas providing a reconfigurable metasurface, each of the electrically rotatable antennas including a disk of optically tunable material. The apparatus also includes a control circuit including a plurality of switches each coupled to (i) one of a plurality of electrodes, the plurality of electrodes being arranged proximate different portions of at least one surface of each of the disks of optically tunable material and (ii) to at least one of a current source and a ground voltage. The control circuit is configured to modify states of portions of the optically tunable material in each of the disks of optically tunable material utilizing current supplied between at least two of the plurality of electrodes to adjust reflectivity of the portions of the optically tunable material to dynamically reconfigure respective antenna shape configurations of each of the electrically rotatable antennas.

20 Claims, 14 Drawing Sheets

(51) Int. Cl.
  *H01Q 1/22* (2006.01)
  *H01Q 3/01* (2006.01)
  *H01L 27/24* (2006.01)

(52) U.S. Cl.
  CPC ...... *H01L 45/1226* (2013.01); *H01L 45/1253* (2013.01); *H01L 45/141* (2013.01); *H01L 45/145* (2013.01); *H01Q 1/2283* (2013.01); *H01Q 3/01* (2013.01); *H01Q 3/44* (2013.01)

(56) References Cited

U.S. PATENT DOCUMENTS

| | | | |
|---|---|---|---|
| 9,813,644 | B1 | 11/2017 | Jackson et al. |
| 9,904,077 | B2 | 2/2018 | Park et al. |
| 9,923,267 | B1 | 3/2018 | Pala et al. |
| 2016/0013549 | A1 | 1/2016 | Schaffner et al. |
| 2017/0033462 | A1* | 2/2017 | Clemente ............. H01Q 9/0407 |
| 2018/0351092 | A1 | 12/2018 | Giessen et al. |
| 2019/0018299 | A1* | 1/2019 | Park ........................ G02F 1/29 |
| 2019/0285798 | A1* | 9/2019 | Akselrod ............. G02B 6/1226 |

OTHER PUBLICATIONS

D.E. Anagnostou et al., "Integration of Resistive Heaters for Phase-Change Reconfigurable Antennas," 11th European Conference on Antennas and Propagation (EUCAP), Mar. 19-24, 2017, pp. 2349-2350.

M. Abb et al., "All-Optical Control of a Single Plasmonic Nanoantenna-ITO Hybrid," Nano Letters, May 4, 2011, pp. 2457-2463, vol. 11, No. 6.

S.Y. Lee et al. "Holographic Image Generation with a Thin-film Resonance Caused by Chalcogenide Phase-change Material," Scientific Reports, Jan. 24, 2017, 8 pages, vol. 7.

A. Karvounis et al., "All-Dielectric Phase-Change Reconfigurable Metasurface," Applied Physics Letters, Jul. 2016, 5 pages, vol. 109.

P. Hosseini et al., "An Optoelectronic Framework Enabled by Low-Dimensional Phase-Change Films," Nature, Jul. 10, 2014, pp. 206-211, vol. 511, No. 7508.

C.H. Chu et al., "Active Dielectric Metasurface Based on Phase-Change Medium," Laser & Photonics Review, Nov. 1, 2016, pp. 986-994, vol. 10, No. 6.

T. Cao et al., "Ultrafast Beam Steering Using Gradient Au—Ge2Sb2Te5—Au Plasmonic Resonators," Optics Express, Jul. 1, 2015, pp. 18029-18039, vol. 23, No. 14.

Y.Y. Au et al., "Phase-Change Devices for Simultaneous Optical-Electrical Applications," Scientific Reports, Sep. 11, 2017, 7 pages, vol. 7, No. 9688.

Q. Wang et al., Optically Reconfigurable Metasurfaces and Photonic Devices Based on Phase Change Materials, Nature Photonics, Dec. 21, 2015. pp. 60-65, vol. 10.

P. Li et al., "Reversible Optical Switching of Highly Confined Phonon-Polaritons with an Ultrathin Phase-Change Material," Nature Materials May 23, 2016, pp. 870-875, vol. 15.

* cited by examiner

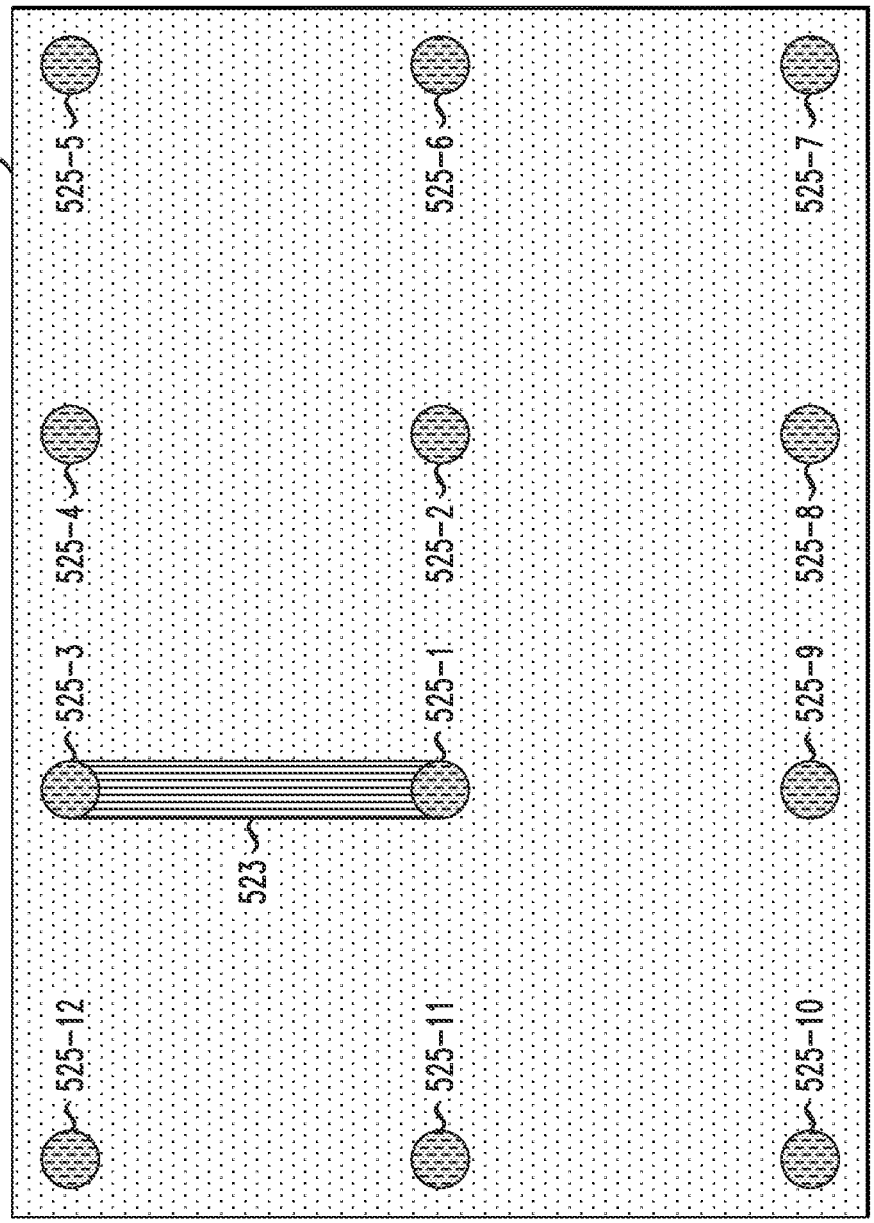

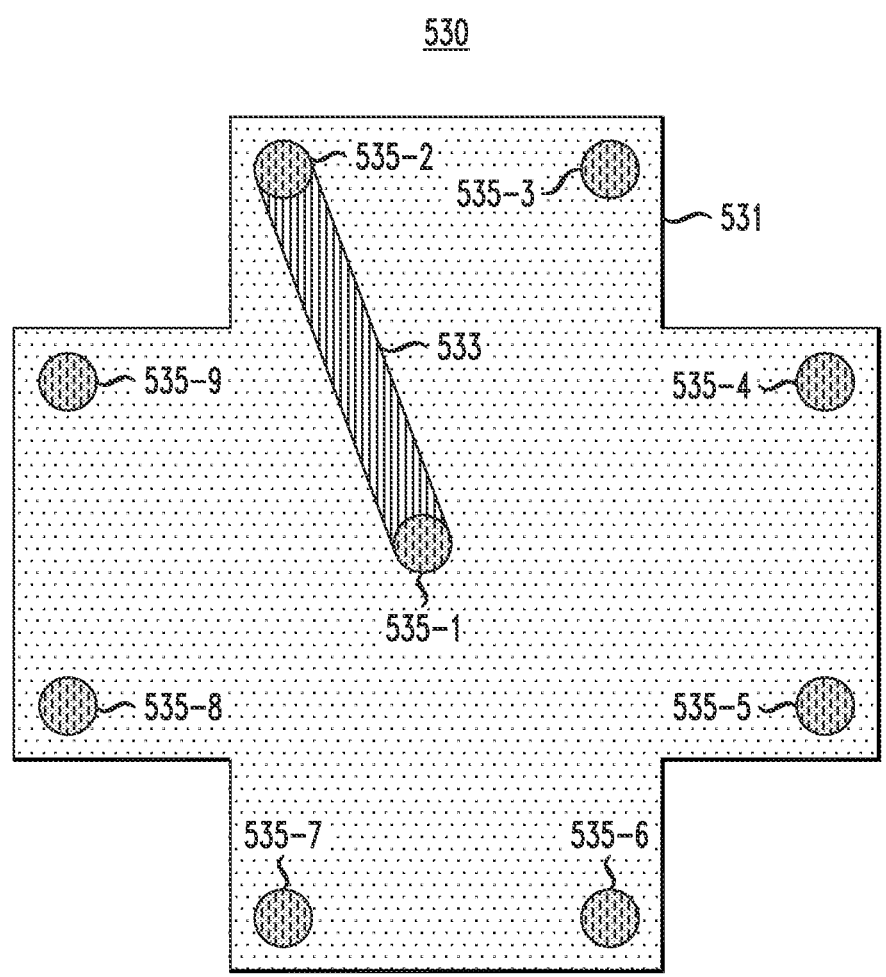

600

700

1000

ELECTRICALLY ROTATABLE ANTENNAS FORMED FROM AN OPTICALLY TUNABLE MATERIAL

BACKGROUND

The present application relates to optics, and more specifically, to techniques for forming metasurfaces. A metasurface includes a two-dimensional array of optical antennas or elements used to direct light. A geometric metasurface is a type of metasurface in which the elements thereof are copies of a single antenna at various rotation angles. Metasurfaces may be used for three-dimensional imaging, holographic displays and various other use cases.

SUMMARY

Embodiments of the invention provide techniques for forming electrically rotatable antennas comprising an optically tunable material.

In one embodiment, an apparatus comprises two or more electrically rotatable antennas providing a reconfigurable metasurface, each of the electrically rotatable antennas comprising a disk of optically tunable material. The apparatus also comprises a control circuit comprising a plurality of switches, each of the plurality of switches being coupled to (i) one of a plurality of electrodes, the plurality of electrodes being disposed proximate different portions of at least one surface of each of the disks of optically tunable material and (ii) to at least one of a current source and a ground voltage. The control circuit is configured to modify states of portions of the optically tunable material in each of the disks of optically tunable material utilizing current supplied between at least two of the plurality of electrodes to adjust reflectivity of said portions of the optically tunable material to dynamically reconfigure respective antenna shape configurations of each of the two or more electrically rotatable antennas.

In another embodiment, a semiconductor structure comprises a substrate, a disk of optically tunable material disposed over the substrate, and a plurality of electrodes disposed proximate different portions of at least one surface of the disk of optically tunable material, each of the plurality of electrodes being coupled to a switch providing at least one of a current source and a ground voltage. The plurality of electrodes are configured to modify a state of at least a portion of the disk of optically tunable material to dynamically reconfigure an antenna shape configuration of an electrically rotatable antenna comprising the disk of optically tunable material.

In another embodiment, a method comprises determining a desired interference effect for a reconfigurable metasurface comprising two or more electrically rotatable antennas, each of the two or more electrically rotatable antennas comprising a disk of optically tunable material and a plurality of switches each coupled to (i) one of a plurality of electrodes, the plurality of electrodes being disposed proximate different portions of at least one surface of each of the disks of optically tunable material and (ii) to at least one of a current source and a ground voltage. The method also comprises utilizing a control circuit to modify states of portions of the optically tunable material in each of the disks of optically tunable material utilizing current supplied between at least two of the plurality of electrodes to adjust reflectivity of said portions of the optically tunable material to dynamically reconfigure respective antenna shape configurations of each of the two or more electrically rotatable antennas to provide the desired interference effect.

BRIEF DESCRIPTION OF THE DRAWINGS

FIG. 5C depicts another top-down view of an electrically rotatable antenna, according to an embodiment of the invention.

FIG. 5D depicts another top-down view of an electrically rotatable antenna, according to an embodiment of the invention.

DETAILED DESCRIPTION

Figure 1:
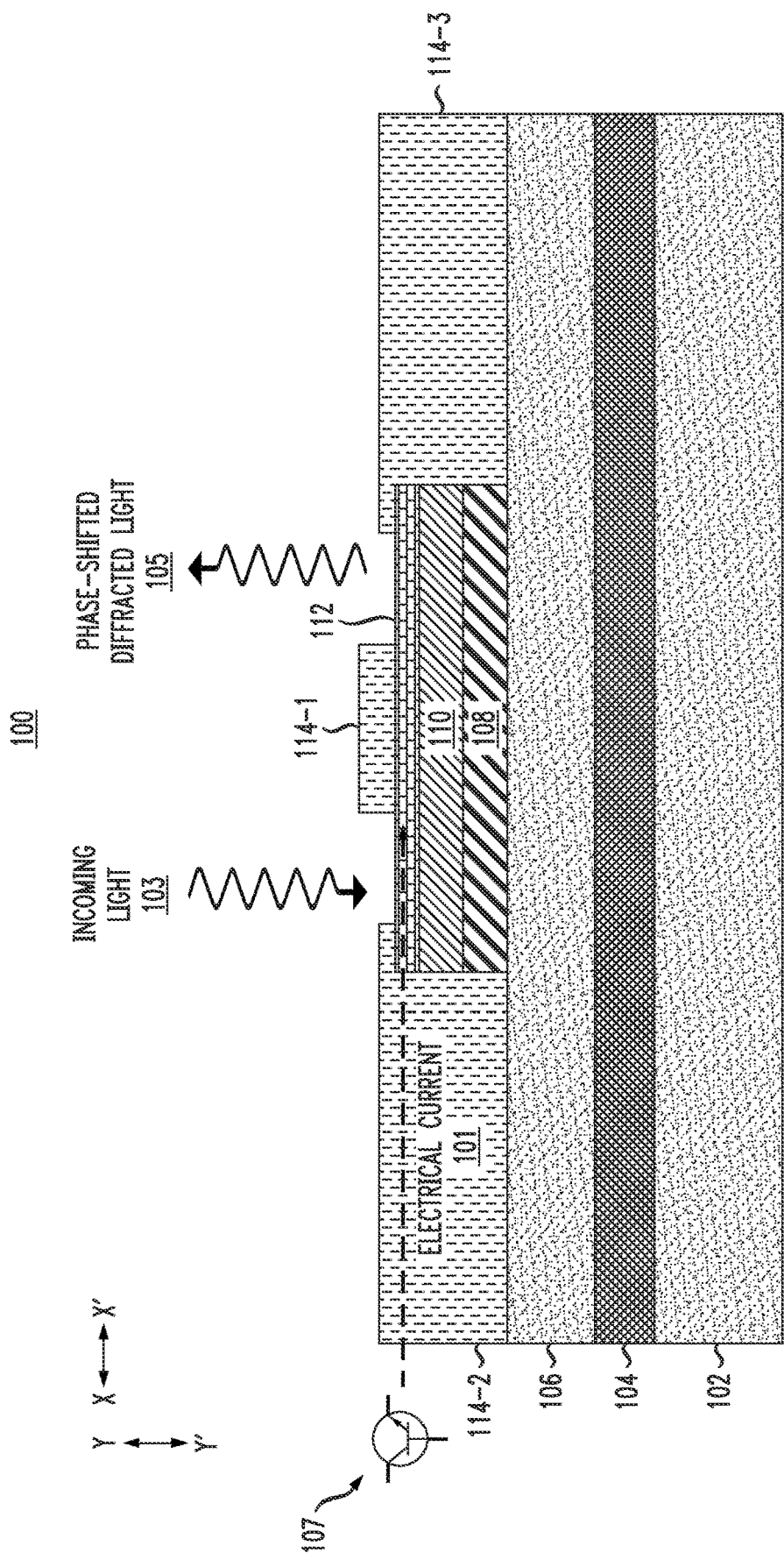
FIG. 1 depicts a side cross-sectional view of an electrically rotatable antenna, according to an embodiment of the invention.

Illustrative embodiments of the invention may be described herein in the context of illustrative methods for forming electrically rotatable antennas using an optically tunable material, where the electrically rotatable antennas may be used to form a reconfigurable metasurface. However, it is to be understood that embodiments of the invention are not limited to the illustrative methods, apparatus, systems and devices but instead are more broadly applicable to other suitable methods, apparatus, systems and devices.

Metasurfaces are two-dimensional arrays of microwave, infrared or optical antennas. When light is incident on a metasurface, each antenna provides a unique intentional delay to the light that is incident on it before radiating it. Each antenna may also absorb some of the light that is incident on it before radiating it. Thus, when a light beam is reflected or transmitted by a metasurface, it has a two-dimensionally varying phase and/or amplitude imprinted on it by the metasurface. Through optical interference and diffraction, this spatially varying phase and/or amplitude response then allows the metasurface to direct light fields into complex patterns. A geometric metasurface is a metasurface in which the elements of the metasurface are copies of a single antenna at various rotation angles. A "reflection-type" metasurface diffracts light in the hemisphere containing the light source, bounded by the metasurface. A "transmission-type" metasurface diffracts light in the other hemisphere (e.g., the hemisphere that does not contain the light source, bounded by the metasurface).

Technologically, metasurfaces enable a wide variety of optical elements to be fabricated in a planar, subwavelength-thick chip or circuit. Examples of such optical elements include but are not limited to planar lenses, waveplates, filters, and polarizers. More sophisticated diffractive optical elements and devices, such as computer-generated holograms (CGHs), can also be generated by metasurfaces. For CGHs, a laser or light beam incident on the metasurface can be controllably reflected or transmitted to produce a three-dimensional (3D) image, without the need for specialized 3D glasses. Diffractive optical elements and devices may also be used in 3D imaging applications, solid-state Light Detection and Ranging (LIDAR) applications, etc.

Developments in nano-photonics have allowed analogs of several advanced radio-frequency and microwave technologies to be scaled down to the visible and infrared regimes. In particular, infrared and visible-frequency metasurfaces, which are two-dimensional arrays of antennas, derive from phased microwave arrays. Such structures have demonstrated their capability as playing the role of a variety of optical elements.

Antennas of a metasurface may be metallic or dielectric. Metal antennas can take advantage of plasmonic effects and be especially small (e.g., on the range of 5 to 200 nm), whereas dielectric antennas form photonic cavities that typically have lower loss. One particularly effective technique is to have antennas fabricated on top of a dielectric-mirror stack. In some cases, a low quality factor out-of-plane Fabry-Perot resonance across the dielectric is set up, which can enhance the effect of the antennas.

In a geometric metasurface, circularly polarized light is incident on the metasurface and the antennas radiate light whose circular polarization is reversed from that of a flat surface. Geometric metasurfaces can be transmissive metasurfaces or reflective metasurfaces. If right-handed circularly polarized (RCP) light is incident on the geometric metasurface, the reflect light from a reflective metasurface would also be RCP, and the transmitted light from a transmissive metasurface would be left-handed circularly polarized (LCP).

Although each antenna in a geometric metasurface reverses the circular polarization of light, if the antennas are fabricated such that the shape of each antenna is identical but the in-plane rotation angle (denoted $\phi$) of each antenna is different, then the transmitted or reflected light from neighboring antennas will display an interference effect that causes the light to diffract non-orthogonally to the plane of the metasurface.

This interference effect is based on the geometric phase, otherwise known as the Pancharatnam-Berry phase, of the light radiated by the antennas. The geometric phase of light may be visualized on a Poincaré sphere 400 shown in FIG. 4. In the Poincaré sphere 400, RCP light is at the north pole, LCP light is at the south pole, and linearly polarized light is at the equator. The geometric phase (denoted $\phi_{geom}$) of light radiating from each antenna has a direct relationship to the in-plane antenna rotation angle ($\phi_{geom}=2\phi$). Thus, $\phi_{geom}$ can be readily spatially controlled across the metasurface.

Compared to conventional phase metasurfaces, which comprise a 2D array of antennas whose shape is spatially varied across the array, geometric phase metasurfaces in which the shape is held constant while the orientation is varied have several advantages. For example, geometric phase metasurfaces typically have higher diffraction efficiencies (e.g., the fraction of incident light that is diffracted into the desired optical mode) than ordinary metasurfaces. Geometric phase metasurfaces are also immune to design and fabrication errors. The geometric phase, which is set by the geometric rotation angle of the antenna, can be designed with greater precision than conventional phase metasurfaces. Geometric phase metasurfaces can also be readily designed to be broadband (e.g., to work at a broad span of optical wavelengths).

A need exists, however, for a design of dynamically tunable geometric metasurfaces. One of the key challenges facing the production of tunable or reconfigurable geometric metasurfaces is that it is typically difficult to change an antenna's orientation. Illustrative embodiments provide reconfigurable geometric metasurfaces enabling change in the orientation of antennas.

In some embodiments, a structure is provided that functions as a reconfigurable geometric metasurface. The structure is based on an array of electrically rotatable antennas formed from an optically tunable material whose state may be altered to achieve a desired shape (e.g., rotation) of the electrically rotatable antennas.

An electrically rotatable antenna, in some embodiments, comprises a disk with a thin film of phase-change material (PCM). The PCM may be an amorphous-to-crystalline PCM such as a chalcogenide PCM. The phase transition of chalcogenide PCMs is thermally driven, and bi-stable at room temperature. Advantageously, the index of refraction of chalcogenide PCM is different in the two phases (e.g., the chalcogenide PCM has a first index of refraction in its amorphous phase and a second index of refraction different than the first index of refraction in its crystalline phase). Chalcogenide PCMs include, but are not limited to, germanium antimony telluride ($Ge_xSb_yTe_z$), germanium telluride ($Ge_xTe_y$), antimony telluride ($Sb_xTe_y$), silver antimony telluride ($Ag_xSb_yTe_z$), silver indium antimony telluride ($Ag_wIn_xSb_yTe_z$), etc. In some embodiments, $Ge_2Sb_2Te_5$ is used for the PCM. In other embodiments, $Ge_3Sb_2Te_2$, GeTe, SbTe, or $Ag_wIn_xSb_yTe_z$ may be used.

In these chalcogenide PCMs, the chalcogenide can be thermally switched between a crystalline phase and an amorphous phase. For example, a first current pulse (e.g., short, intense current pulses, such as current pulses with an intensity of 5 volts and a duration of 50 nanoseconds) may be used to Joule-heat an amorphous phase chalcogenide PCM (e.g., $Ge_xSb_yTe_z$) to a temperature of about 300 degrees Celsius (° C.), which causes the amorphous phase chalcogenide PCM to crystallize. A second current pulse (e.g., longer, less intense current pulses, such as current pulses with an intensity of 3 volts and a duration of 1 millisecond) with higher power but slower pulsing may be used to Joule-heat the crystalline phase chalcogenide PCM to a temperature of about 600° C. which causes the crystalline phase chalcogenide PCM to melt-quench into the amorphous phase. In these two different phases, the chalcogenide has different optical properties. Thus, the resonant frequency of the antennas can be switched.

In other embodiments, however, the optically tunable material may comprise an electrically tunable plasmonic material (e.g., graphene, carbon nanotubes, a metal oxide, a metal nitride such as titanium nitride (TiN), etc.), a metal-insulator transition material (e.g., vanadium dioxide ($VO_2$), etc.), an ion-driven electrochromic material such as tungsten oxide ($WO_3$), etc. While various embodiments are described below in the context of using a PCM as the tunable optical material, it should be appreciated that the PCM may be replaced with these alternatives as desired for a particular implementation.

Electrically rotatable antennas comprising disks of PCM are used to form a reconfigurable reflective metasurface. By "reflective" it is meant that the reconfigurable metasurface diffracts light to the hemisphere that includes the illumination source. In some embodiments, however, the electrically rotatable antennas may be used in forming a reconfigurable transmissive metasurface, though in such cases the electronics in the overall device should be transparent.

The PCM may be enclosed in a low quality-factor resonator, comprising a back-plane mirror and dielectric materials on both the top and bottom of the disk of PCM. The resonator can enhance the diffraction efficiency of the electrically rotatable antenna. The diffraction efficiency of a metasurface is defined as the fraction of light whose circular polarization is reversed by the antennas. This is also the fraction of light that can participate in the geometrical phase interference and contribute to the desired image.

A reconfigurable metasurface may include multiple electrically rotatable antennas. In the description below, the term "pixel" is used to refer to individual ones of the electrically rotatable antennas forming a reconfigurable metasurface. In each pixel of PCM, one electrode is placed at the center of the PCM disk. This electrode will be connected to an electrical ground, and is referred to as a center ground electrode. A ring of outer electrodes is fabricated on the outer edge of the PCM disk. These outer ring electrodes will be connected to switches that can source current through the PCM disk. The current can then switch the phase of the PCM in the radial line of the PCM disk between the outer ring electrodes and the center ground electrode. The phase can be switched from a crystalline to an amorphous phase, or from an amorphous to a crystalline phase. By consecutively switching phases from each of the outer ring electrodes, lines of PCM in a first desired phase (e.g., one of crystalline or amorphous) can be written into the PCM disk in any orientation, while the rest of the PCM is in the other phase (e.g., the other one of crystalline and amorphous). Through this procedure, the pattern written into each PCM disk can be rotated providing an electrically rotatable antenna. Multiple such electrically rotatable antennas can provide pixels of a reconfigurable metasurface.

The patterned PCM disks, in conjunction with the surrounding dielectrics and metal back plane, can function as electrically rotatable antennas for visible or infrared light. Light that is incident on these electrically rotatable antennas can excite antenna modes and then be re-radiated outwards. The intensity and phase of light that is re-radiated depends on several factors, including: (i) the wavelength of the incident light; (ii) the material composition of the dielectrics, PCM, and metals; (iii) the thickness of the dielectrics; (iv) the diameter of the PCM disks; and (v) the intensity of the current pulses used to switch the PCM, which will in turn determine the size of the amorphous or crystalline lines written into the PCM disks. Using factors (ii)-(v), the electrically rotatable antennas can be optimized so that they reverse the circular polarization of light that is incident on them. An array of such electrically rotatable antennas functions as reconfigurable geometric metasurface. The $\phi_{geom}$ parameters, which control the geometric phase interference, will be controlled by the angle of each electrically rotatable antenna.

FIG. 1 shows a side cross-sectional view 100 of an electrically rotatable antenna, including a substrate 102, mirror 104, dielectric layer 106, PCM 108, dielectric layer 110, transparent conductor layer 112, and electrodes 114-1, 114-2 and 114-3 (collectively, electrodes 114).

The substrate 102 may be formed of silicon (Si) or another suitable material such as glass ($SiO_2$), calcium fluoride ($CaF_2$), zinc selenide (ZnSe) or another suitable material. The substrate 102 may have a vertical thickness or height (in direction Y-Y') in the range of 50 micrometers (μm) to 1000 μm.

The mirror 104 may be a metal mirror formed of aluminum (Al), silver (Ag), gold (Au), platinum (Pt), titanium nitride (TiN) or another suitable material. The mirror 104 may have a vertical thickness or height (in direction Y-Y') in the range of 50 nm to 500 nm.

The dielectric layer 106 may be formed of magnesium fluoride ($MgF_2$), silicon dioxide ($SiO_2$), silicon nitride (SiN), titanium oxide (TiO) or another suitable material. The dielectric layer 106 may have a vertical thickness or height (in direction Y-Y') in the range of 30 nm to 500 nm.

The dielectric layer 110 may be formed of $MgF_2$, $SiO_2$, SiN, TiO or another suitable material. The dielectric layer 110 may have a vertical thickness or height (in direction Y-Y') in the range of 3 nm to 300 nm.

The transparent conductor 112 may be formed of indium tin oxide (ITO) or another suitable material such as TiN, an AZO compound, etc. The transparent conductor 112 may have a vertical thickness or height (in direction Y-Y') in the range of 5 nm to 200 nm.

The electrode 114-1 provides a center ground electrode, while the electrodes 114-2 and 114-3 provider outer ring electrodes as described above. The electrodes 114 may be formed of platinum (Pt) or another suitable refractory material such as TiN, tantalum nitride (TaN), tungsten (W), etc. The electrode 114-1 is formed to be substantially or approximately in the center of the disk of PCM 108. The electrode 114-1 may have a vertical thickness or height (in direction Y-Y') in the range of 5 nm to 300 nm. The electrode 114-1 may have a horizontal thickness or width (in direction X-X') in the range of 50 nm to 500 nm. Each of the electrodes 114-2 and 114-3 may have a vertical thickness or height (in direction Y-Y') in the range of 50 nm to 500 nm. Each of the electrodes 114-2 and 114-3 may have a horizontal thickness or width (in direction X-X') in the range of 100 nm to 500 nm.

The disk of PCM 108 is surrounded by bottom dielectric layer 106 and top dielectric layer 110. The mirror 104 (e.g., a metal mirror) is beneath the bottom dielectric layer 106, and transparent conductor layer 112 is formed above the top dielectric layer 110. Electrical current 101 flows from a switch 107 coupled to electrode 114-2 and is directed across the transparent conductor 112 towards the central ground electrode 114-1, which is assumed to be connected to a ground voltage. This creates Joule heating that is conducted down to a portion of the PCM 108 (e.g., in a "line" from the outer ring electrode 114-2 to the center ground electrode 114-1) to change the phase of that portion of the PCM 108. A pulse of heat can either crystallize or melt-quench the PCM, depending on its waveform as described in further detail below.

Incoming light 103 that is incident on the electrically rotatable antenna of FIG. 1 from the top is coupled into antenna modes and then re-radiated or diffracted upwards as phase-shifted diffracted light 105. The phase-shifted diffracted light 105 will have an ordinary phase that depends on: (i) the composition and shape of the materials of the FIG. 1 electrically rotatable antenna; and (ii) the shape of the crystalline or amorphous line or lines that are written into the PCM 108 by applying current between respective ones of the outer ring electrodes (e.g., two of which, electrodes 114-2 and 114-3, are shown in the side cross-sectional view 100) and the center ground electrode 114-1. The geometric phase of the phase-shifted diffracted light 105 will depend on the orientation of the line or lines written into the PCM 108.

Figure 2:
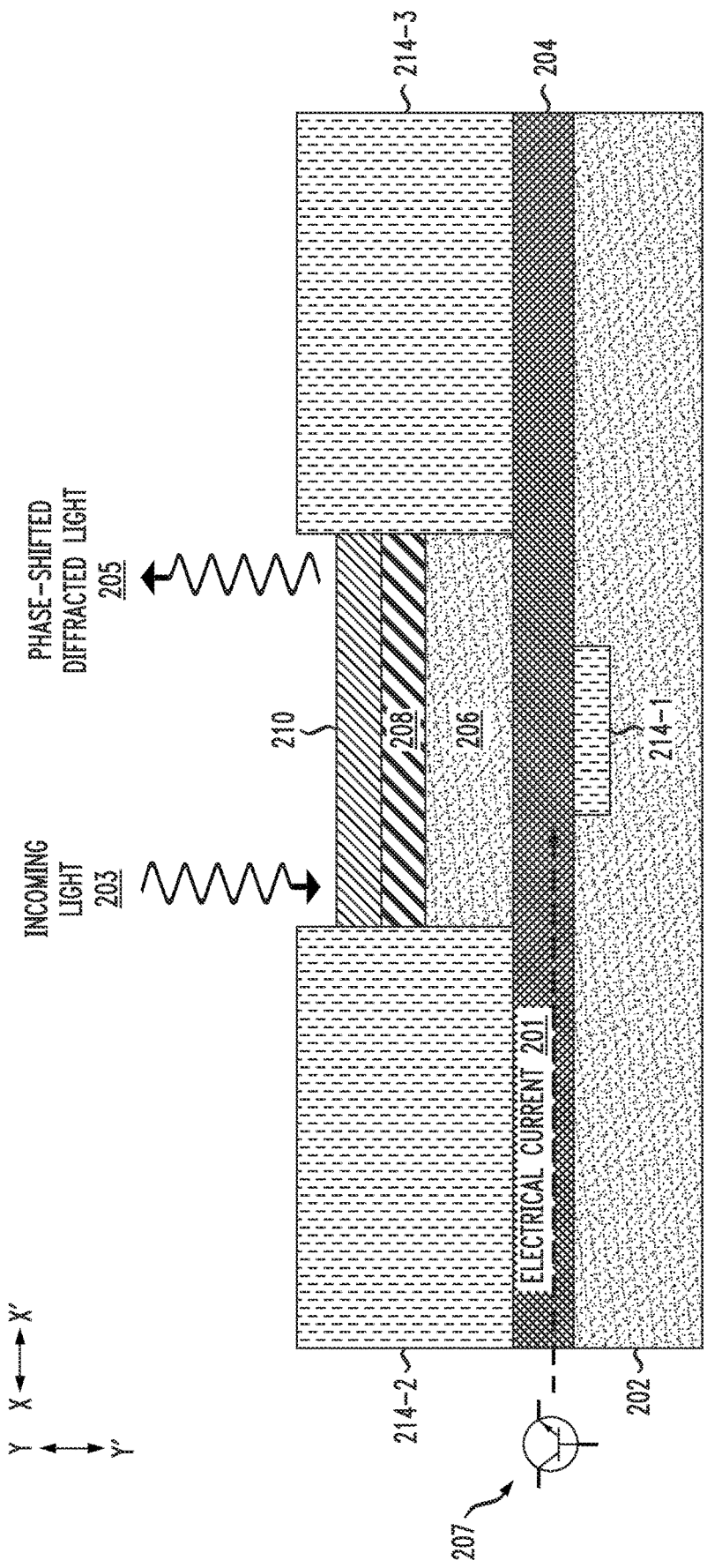
FIG. 2 depicts another side cross-sectional view of an electrically rotatable antenna, according to an embodiment of the invention.

FIG. 2 depicts a side cross-sectional view 200 of another electrically rotatable antenna, including a substrate 202, mirror 204, PCM 208, a dielectric layer 210 and electrodes 214-1, 214-2 and 214-3 (collectively, electrodes 214). The substrate 202, mirror 204, PCM 208 and electrodes 214 may be formed of similar materials and with similar sizing as that described above with respect to the substrate 102, mirror 104, PCM 108 and electrodes 114, respectively, though the positioning of electrode 214-1 is different in that it is embedded in the substrate 202 rather than being formed over a top of the structure (e.g., like electrode 114-1 in FIG. 1). The dielectric layer 206 may be formed of materials similar to that of dielectric layer 106, and may have a similar sizing (in direction Y-Y') as that of the dielectric layer 106. The horizontal thickness of the dielectric layer 206, however, differs and matches that of the PCM 208 and dielectric layer 210.

In the FIG. 2 electrically rotatable antenna, instead of electrical current passing through a transparent conductor on the top of the PCM/dielectric stack (as in FIG. 1), electrical current 201 is passed from switch 207 via electrode 214-2 through the back mirror 204 towards the center ground electrode 214-1, which is embedded in the substrate 202. The advantage of the FIG. 2 configuration is that a transparent conductor is not needed. Transparent conductors are never fully transparent, and thus always absorb some light leading to a loss of efficiency of the antenna beneath. The disadvantage of the FIG. 2 configuration is that when the antenna is heated from below, a certain amount of heat is conducted down into the substrate 202 instead of upwards towards the PCM 208. Thus, although the FIG. 2 antenna configuration is more optically efficient than the FIG. 1 antenna configuration, the FIG. 2 antenna configuration requires more electrical energy to reconfigure (e.g., to change the phase of the PCM 208 by writing "lines" between ones of the outer ring electrodes and the center ground electrode 214-1). Similar to the electrically rotatable antenna of FIG. 1, incoming light 203 that is incident on the electrically rotatable antenna of FIG. 2 is reflected as phase-shifted diffracted light 205, controllably based on the phase of the PCM 208.

Figure 3:
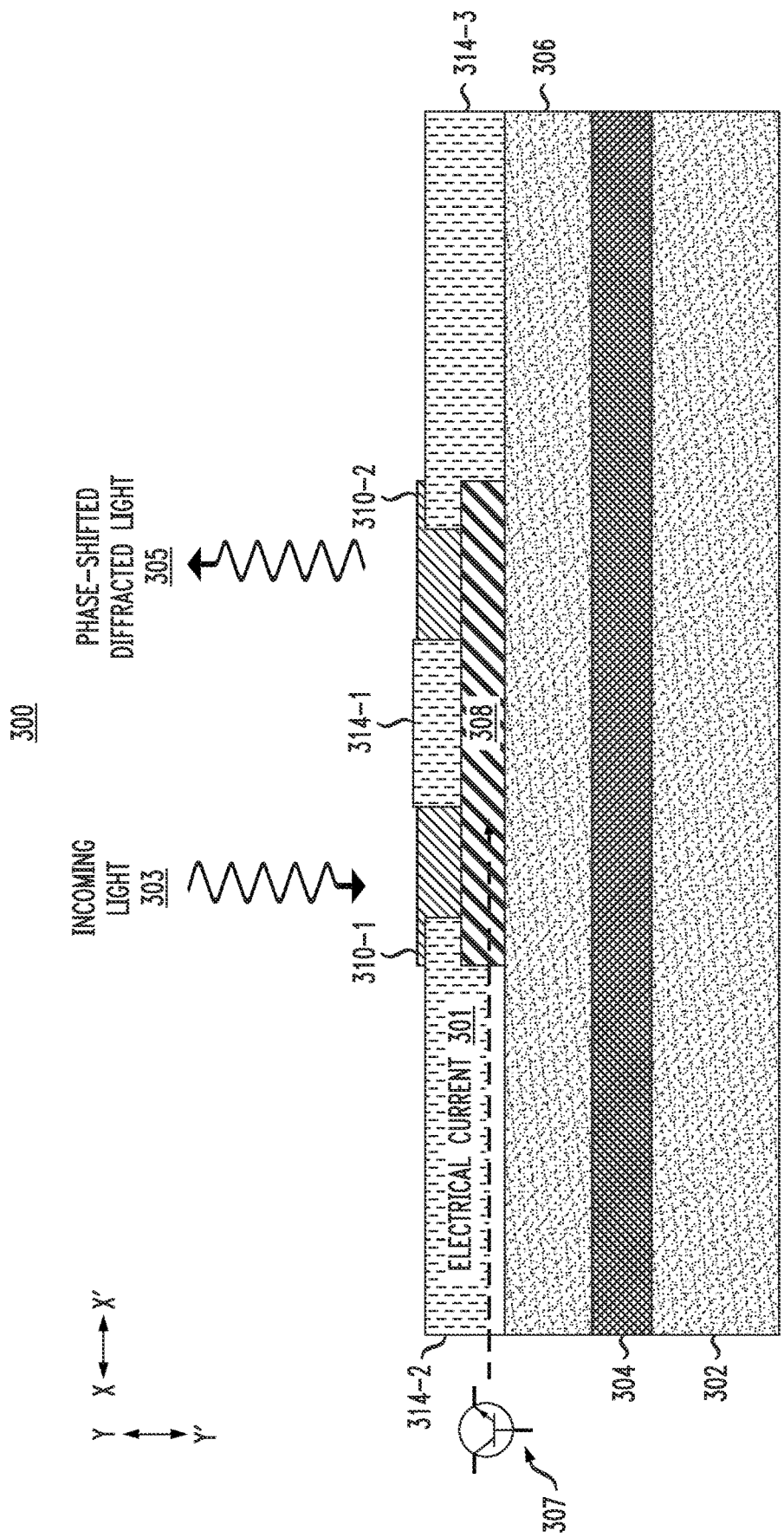
FIG. 3 depicts another side cross-sectional view of an electrically rotatable antenna, according to an embodiment of the invention.

FIG. 3 shows a side cross-sectional view 300 of another electrically rotatable antenna, including a substrate 302, mirror 304, dielectric layer 306, PCM 308, a dielectric layer having portions 310-1 and 310-2 (collectively, dielectric layer 310) surrounding center ground electrode 314-1, and outer ring electrodes 314-2 and 314-3. Electrodes 314-1, 314-2 and 314-3 are collectively referred to as electrodes 314. The substrate 302, mirror 304, dielectric layer 308, PCM 308 and electrodes 314 may be formed of similar materials and with similar sizing as that described above with respect to the substrate 102, mirror 104, dielectric layer 106, PCM 108 and electrodes 114, respectively. The dielectric layer 310 may be formed of similar materials and with similar sizing as that described above with respect to the dielectric layer 110, with the exception of the center ground electrode 314-1 that is embedded as illustrated.

In the FIG. 3 electrically rotatable antenna, electrical current 301 from switch 307 coupled to electrode 314-2 passes directly through the PCM 308. The advantage of the FIG. 3 antenna configuration is that the heating happens directly in the PCM 308 and, thus, there is no heat conduction loss as heat is transported from an external heater to the PCM 308. The disadvantage of the FIG. 3 antenna configuration is that filamentation effects, deriving from nonlinear current-voltage characteristics in the PCM 308, can complicate the switching of the phase of the PCM 308 (e.g., due to filamentation effects, the switching between phases may not be uniform).

It should be appreciated that the electrically rotatable antenna configurations shown in FIGS. 1-3 are presented by way of example only, and that embodiments are not limited to these specific electrically rotatable antenna configurations. Various other arrangements may be used, including variations for transmission versus reflection of incident light, different arrangements of electrodes, insulator layers, transparent conductors, etc. Further, as noted above, while the electrically rotatable antennas of FIGS. 1-3 are described with respect to using a PCM as the optically tunable material, in other embodiments various other optically tunable materials may be used in place of or in addition to a PCM.

Figure 4:
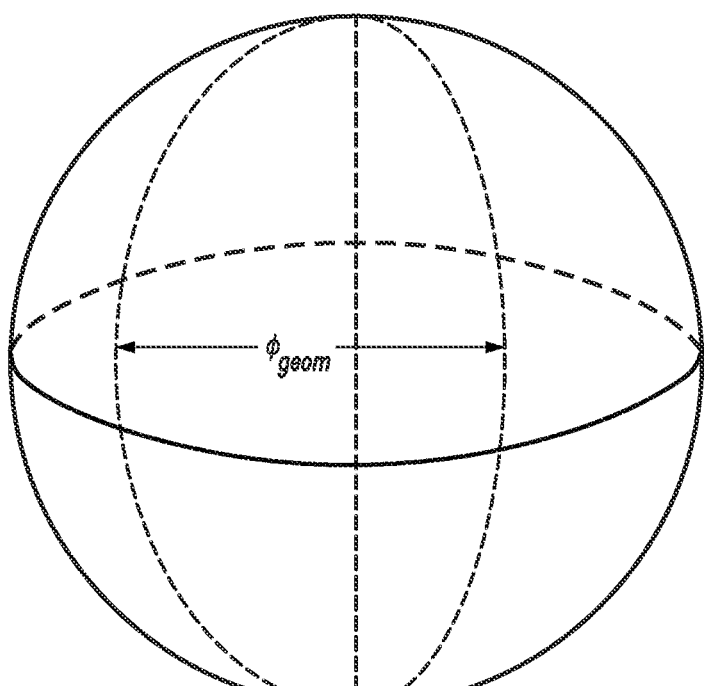
FIG. 4 depicts a Poincaré sphere representing the polarization of light, according to an embodiment of the invention.

FIG. 4, as noted above, illustrates the Poincaré sphere 400 representing the polarization of light. The north pole of the Poincaré sphere 400 represents RCP and the south pole of the Poincaré sphere 400 represents LCP. When light reflects off of an ordinary mirror its circular polarization reverses. The electrically rotatable antennas illustrated in FIGS. 1-3 are designed so that RCP light reflects as right-handed and the left-handed incident light reflects to have LCP (e.g., its phase is reversed from that of light reflecting off of an ordinary mirror). The longitudinal path along the Poincaré sphere 400 determines the $\phi_{geom}$ acquired by the re-radiated light due to the presence of the antenna. Through the relationship $\phi_{geom}=2\phi$, where $\phi$ specifies the orientation of antenna, the geometric phase of the re-radiated light can thus be specified by the orientation angle of an antenna.

Figure 5A:
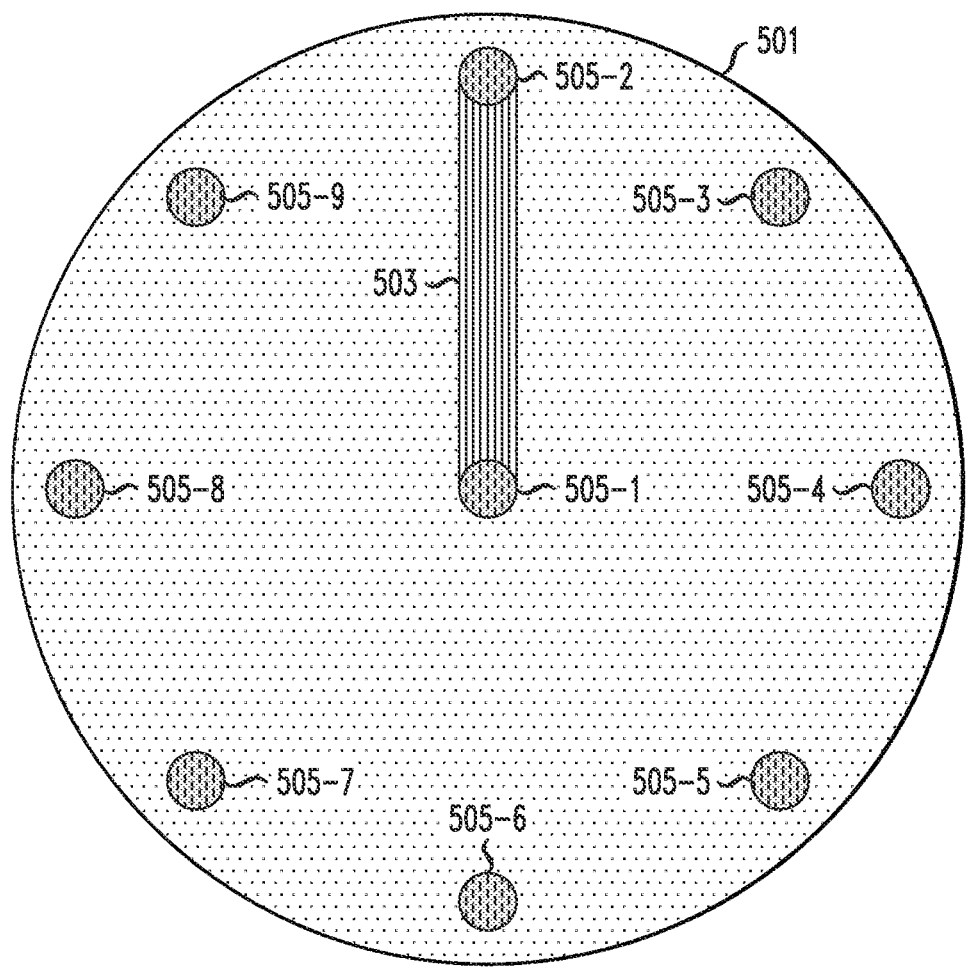
FIG. 5A depicts a top-down view of an electrically rotatable antenna, according to an embodiment of the invention.

FIG. 5A depicts a top-down view 500 of an electrically rotatable antenna, which includes a disk 501 of optically tunable material, a center ground electrode 505-1 and a plurality of outer ring electrodes 505-2 through 505-9. In the description below, it is assumed that the optically tunable material used in FIGS. 5A-5E and in FIGS. 6-10 is a PCM such as $Ge_2Sb_2Te_5$ (GST) that may be patterned to be amorphous or crystalline (e.g., a-GST and c-GST, respectively). In the top-down view 500, only the PCM is shown for clarity of illustration. The top and bottom dielectrics as well as the mirror shown in the side cross-sectional views of FIGS. 1-3 are omitted. It is further assumed, in the FIG. 5A embodiment, that the background PCM 501 is amorphous GST (a-GST). A line of crystalline GST (c-GST) 503 is formed by applying a current pulse from one of the outer ring electrodes 505-2 to the center ground electrode 505-1. It should be appreciated, however, that the background PCM 501 may be c-GST and the line 503 may be a-GST as desired. The c-GST line 503 functions as a patch antenna, that is optimized to rotate the phase of incident light by 180°, from the north pole of the Poincaré sphere 400 illustrated in FIG. 4 down to the south pole. Which circumferential is chosen for this antenna (e.g., which of the outer ring electrodes 505-2 through 505-9) determines $\phi$ and hence $\phi_{geom}$.

Although FIG. 5A shows an embodiment where the "disk" of PCM used to form an electrically rotatable antenna is circular, this is not a requirement. Various other shaped disks may be used in other embodiments, including elliptical disks, square or other rectangular disks, cross-shaped disks, star-pattern disks, etc. Further, the number and arrangement of the electrodes relative to the disk may vary. In some cases, more or fewer than eight outer ring electrodes are utilized. Further, while FIG. 5A shows an example where the spacing between the outer ring electrodes is equal, in other embodiments the spacing between outer ring electrodes may be non-uniform. Still further, the center ground electrode may be omitted, and "lines" of a desired phase of the PCM may be formed by applying current between a pair of outer ring electrodes as desired. In still other embodiments, two or more "center" ground electrodes are used. The two or more center ground electrodes may be configured for coupling to different sets of outer ring electrodes, or each center ground electrode may be configured for coupling to each outer ring electrode. Using different shapes of PCM disks and different numbers of electrodes, various complex antenna shape configurations may be achieved. FIGS. 5B through 5E show non-limiting examples of such variations in the disk shape and electrode configurations.

Figure 5B:
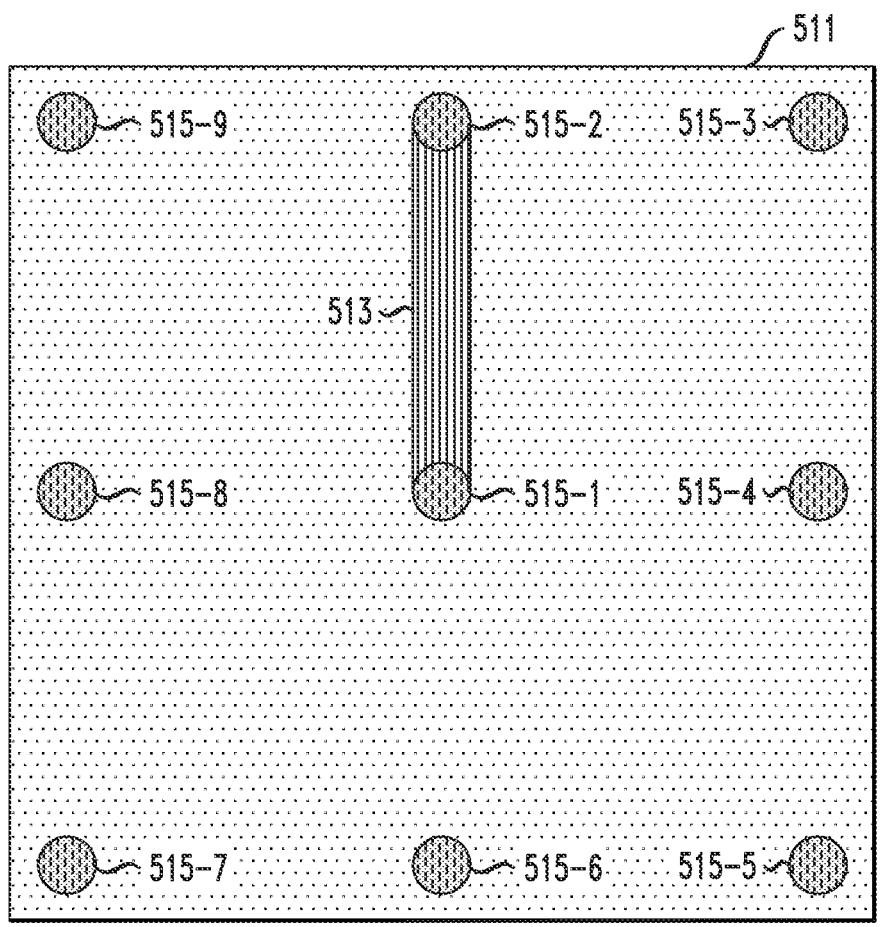
FIG. 5B depicts another top-down view of an electrically rotatable antenna, according to an embodiment of the invention.

FIG. 5B shows a top-down view 510 of a square-shaped PCM disk 511, with a center ground electrode 515-1, outer ring electrodes 515-2 through 515-9, and a line 513 formed by applying current from outer ring electrode 515-2 to the center ground electrode 515-1.

FIG. 5C shows a top-down view 520 of a rectangular-shaped PCM disk 521, with two center ground electrodes 525-1 and 525-2, outer ring electrodes 525-3 through 525-12, and a line 523 formed by applying current from outer ring electrode 525-3 to center ground electrode 525-1.

FIG. 5D shows a top-down view 530 of a cross-shaped PCM disk 531, with a center ground electrode 535-1, outer ring electrodes 535-2 through 535-9, and a line 533 formed by applying current from outer ring electrode 535-2 to center ground electrode 535-1.

Figure 5E:
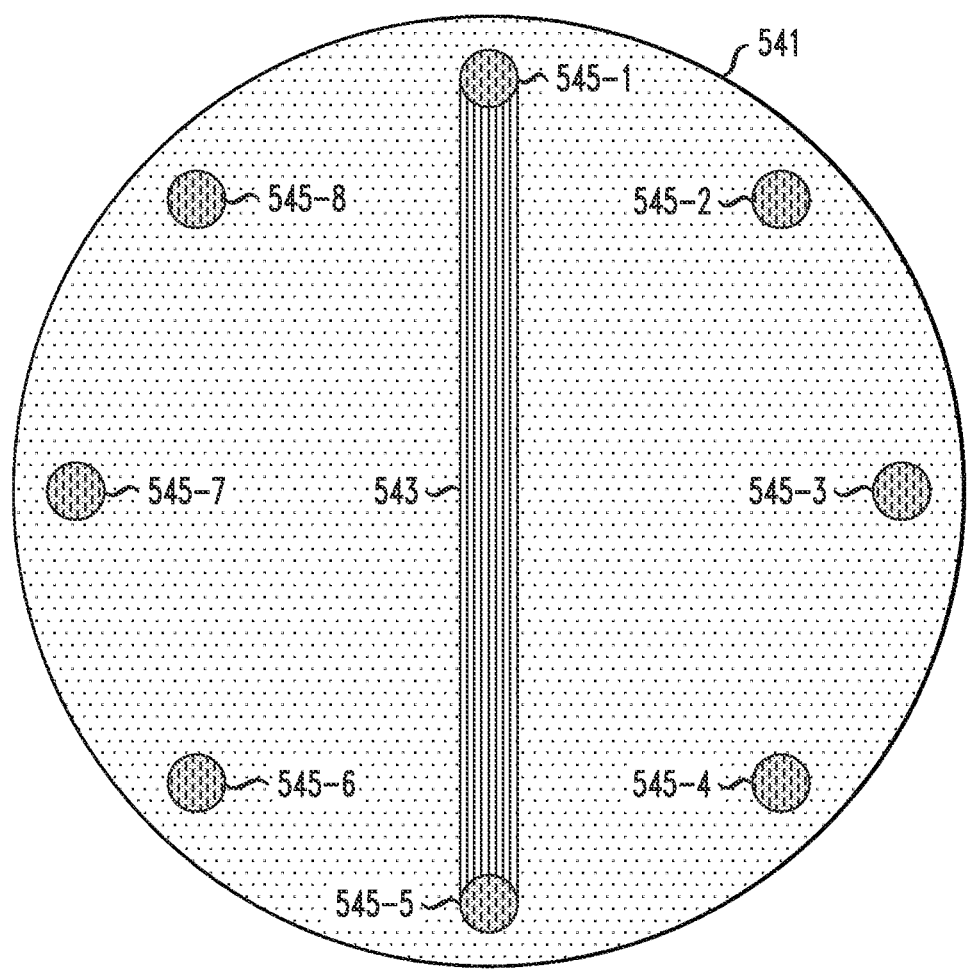
FIG. 5E depicts another top-down view of an electrically rotatable antenna, according to an embodiment of the invention.

FIG. 5E shows a top-down view 540 of a circular-shaped PCM disk 541, with no center ground electrode, outer ring electrodes 545-1 through 545-8, and a line 543 formed by applying current between outer ring electrodes 545-1 and 545-5.

Again, it should be noted that the disk shape and electrode layouts shown in FIGS. 5A through 5E are presented by way of example only, and that various other types of disk shapes and electrode layouts may be used in other embodiments.

Figure 6:
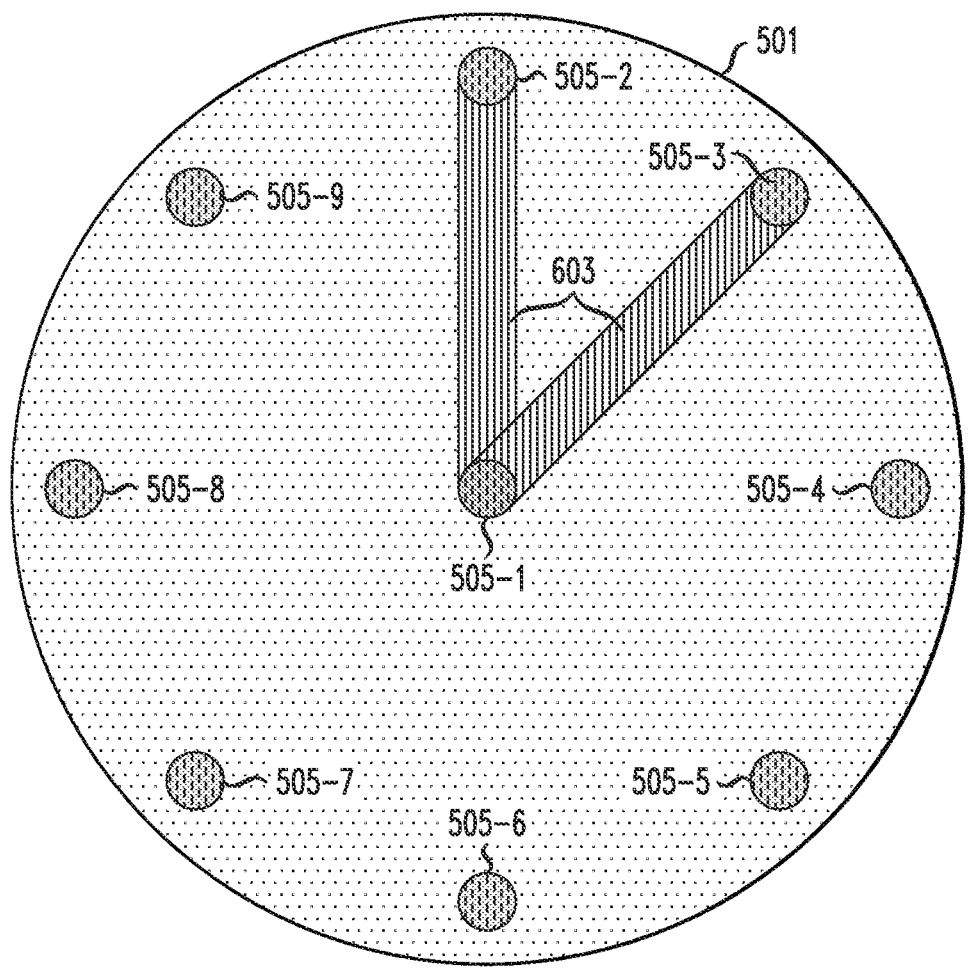
FIG. 6 depicts a top-down view of another configuration of the FIG. 5A electrically rotatable antenna, according to an embodiment of the invention.

FIG. 6 shows a top-down view 600 of another configuration of the FIG. 5A electrically rotatable antenna. In the FIG. 6 configuration a set of lines 603 is formed by applying current between each of the outer ring electrodes 505-2 and 505-3 and the center ground electrode 505-1. The set of lines 603 form a Babinet-style antenna with the lines 603 forming a "V." The Babinet-style antenna functions similarly to the patch antenna of FIG. 5A, but allows for greater $\phi_{geom}$ relative to the patch antenna of FIG. 5A.

Figure 7:
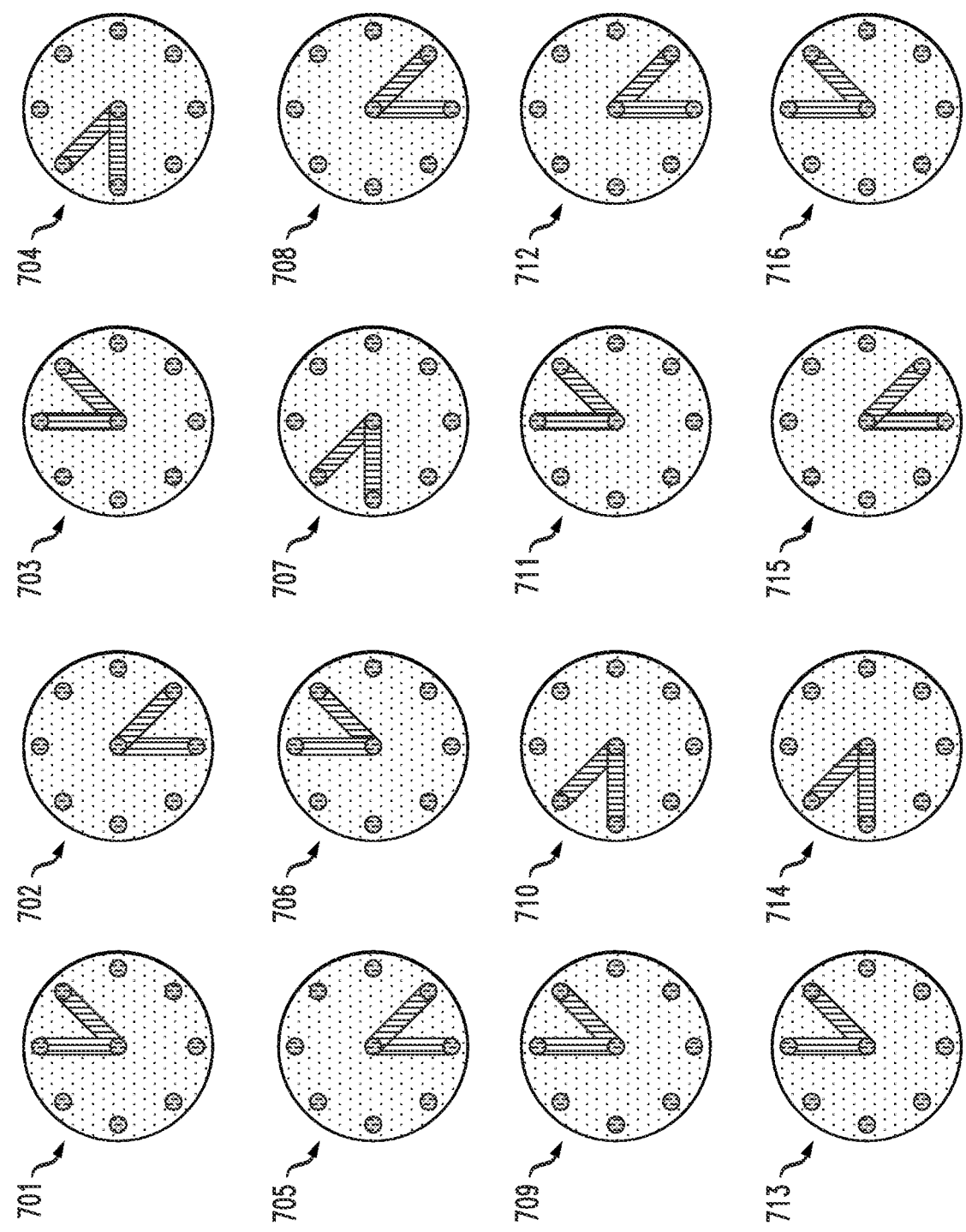
FIG. 7 depicts a top-down view of an array of electrically rotatable antennas providing a reconfigurable metasurface, according to an embodiment of the invention.

FIG. 7 shows a top-down view 700 of an array of electrically rotatable antennas 701 through 716. Each of the electrically rotatable antennas 701 through 716 is assumed to be configured in a manner similar to that described above with respect to FIG. 6, though with current applied through different sets of the outer ring electrodes to rotate the Babinet-style "V" antenna as illustrated. The two-dimensional array of electrically rotatable antennas forms a reconfigurable metasurface, that can diffract light into a complex light field. In some embodiments, to achieve optimal diffraction angles, the pitch between the antennas 701 through 716 is $\lambda/2$, where $\lambda$ is the wavelength of light. Thus, for visible light, with $\lambda$ in the range of 450 to 700 nm, the pitch should be in the range of 225 to 350 nm.

Figure 8:
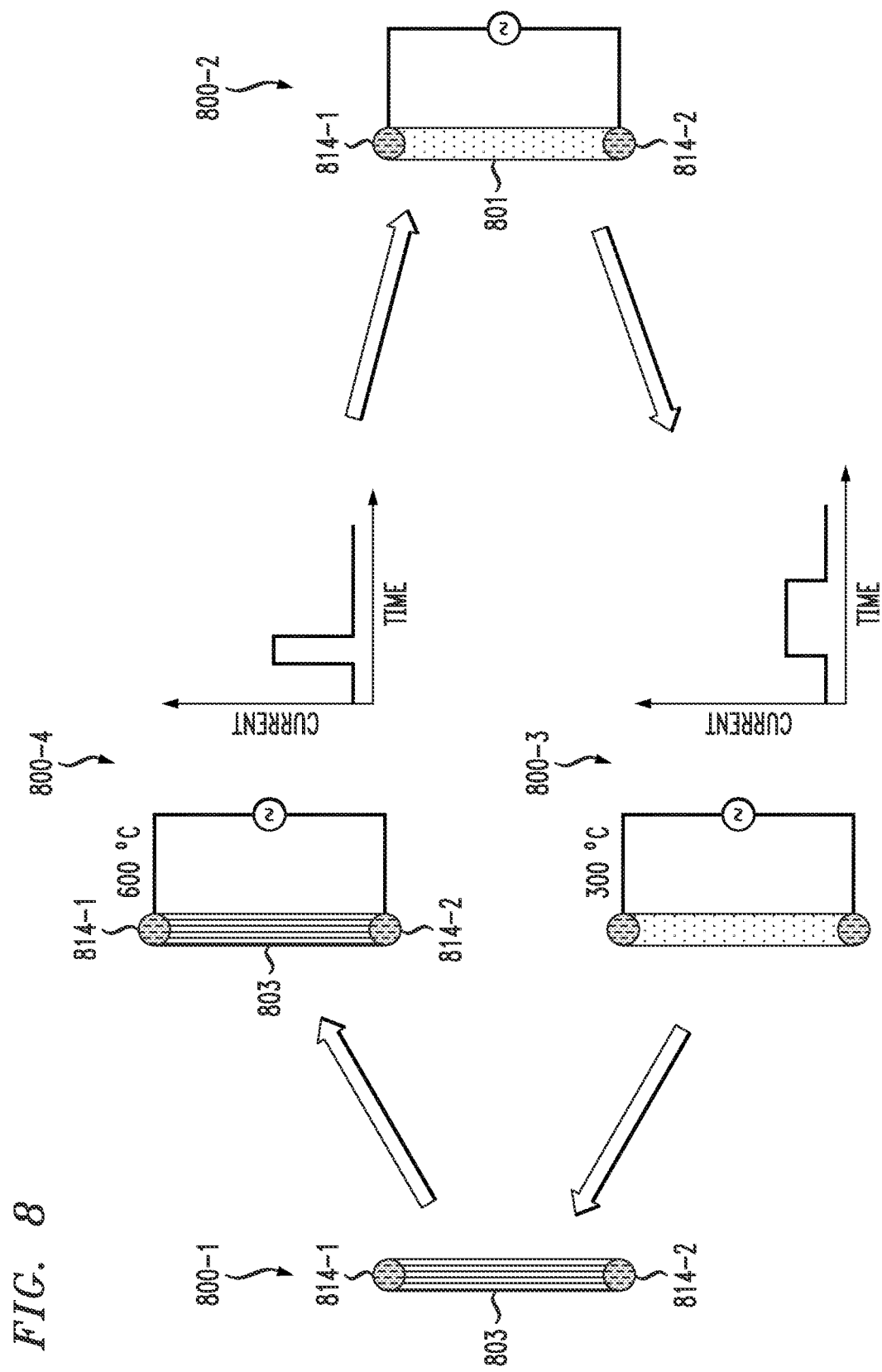
FIG. 8 depicts a process for tuning a phase-change material of an electrically rotatable antenna, according to an embodiment of the invention.

FIG. 8 shows a process for tuning a PCM of an electrically rotatable antenna between a crystalline state and an amorphous state. The crystalline state is represented in 800-1, with a line of c-GST 803 formed between two electrodes 814-1 and 814-2. The amorphous state is represented in 800-2, with a line 801 of a-GST formed between the two electrodes 814-1 and 814-2. In a "set" process illustrated in 800-3, a current pulse Joule-heats the line 801 of a-GST to 300° C., which causes a-GST line 801 to crystallize and form the c-GST line 803 in state 800-1. In a "reset" process, a higher power but slower current pulse Joule-heats the c-GST line 803 to 600° C. as illustrated in 800-4. This causes the c-GST line to melt-quench into its amorphous form to provide the a-GST line 801 in state 800-2.

Figure 9:
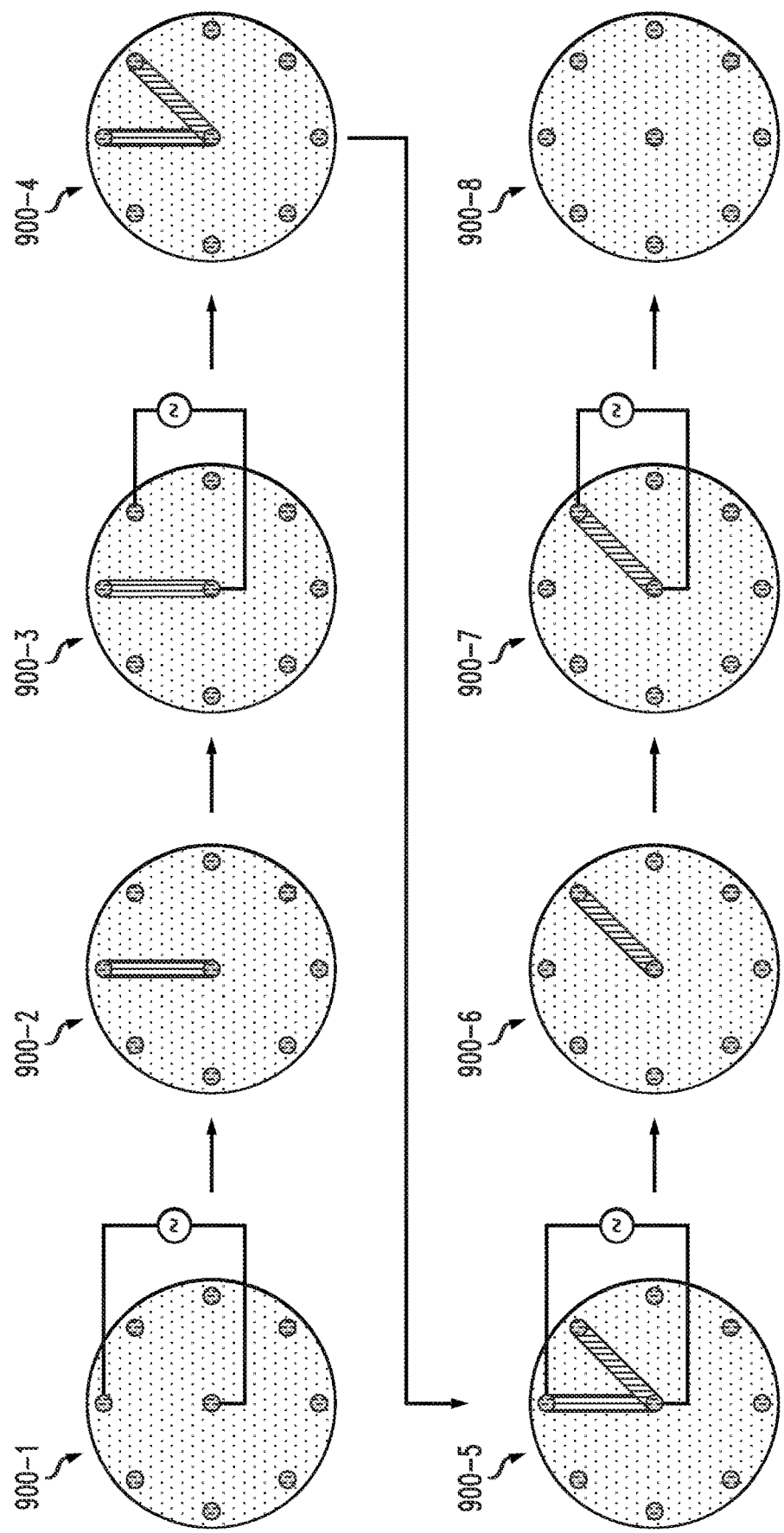
FIG. 9 depicts a process for tuning an electrically rotatable antenna to form a Babinet "V" antenna shape configuration, according to an embodiment of the invention.

FIG. 9 shows a process for tuning an electrically rotatable antenna to form a Babinet "V" antenna shape configuration (e.g., using the "set" and "reset" processes described above with respect to FIG. 8). In state 900-1, a PCM disk is in its amorphous state (e.g., a-GST) and current is applied between one of the outer ring electrodes and the center ring electrode, forming a line of c-GST as illustrated in state 900-2. In state 900-3, current is applied between another one of the outer ring electrodes and the center ring electrode, forming another line of c-GST as illustrated in state 900-4. A Babinet-style "V" antenna is then written. States 900-5 through 900-8 illustrate how the Babinet-style "V" antenna is erased. In state 900-5, current is applied between the electrodes at ends of one of the c-GST lines to convert that c-GST line back to a-GST as illustrated in state 900-6. In state 900-7, current is applied between the electrodes at ends of the other one of the c-GST lines to convert that c-GST line back to a-GST as illustrated in state 900-8. While FIG. 9 assumes that c-GST lines are written in a-GST, a-GST lines may alternately be written in c-GST (e.g., the "background" states 900-1 and 900-8 may be c-GST, where the lines formed are a-GST).

Figure 10:
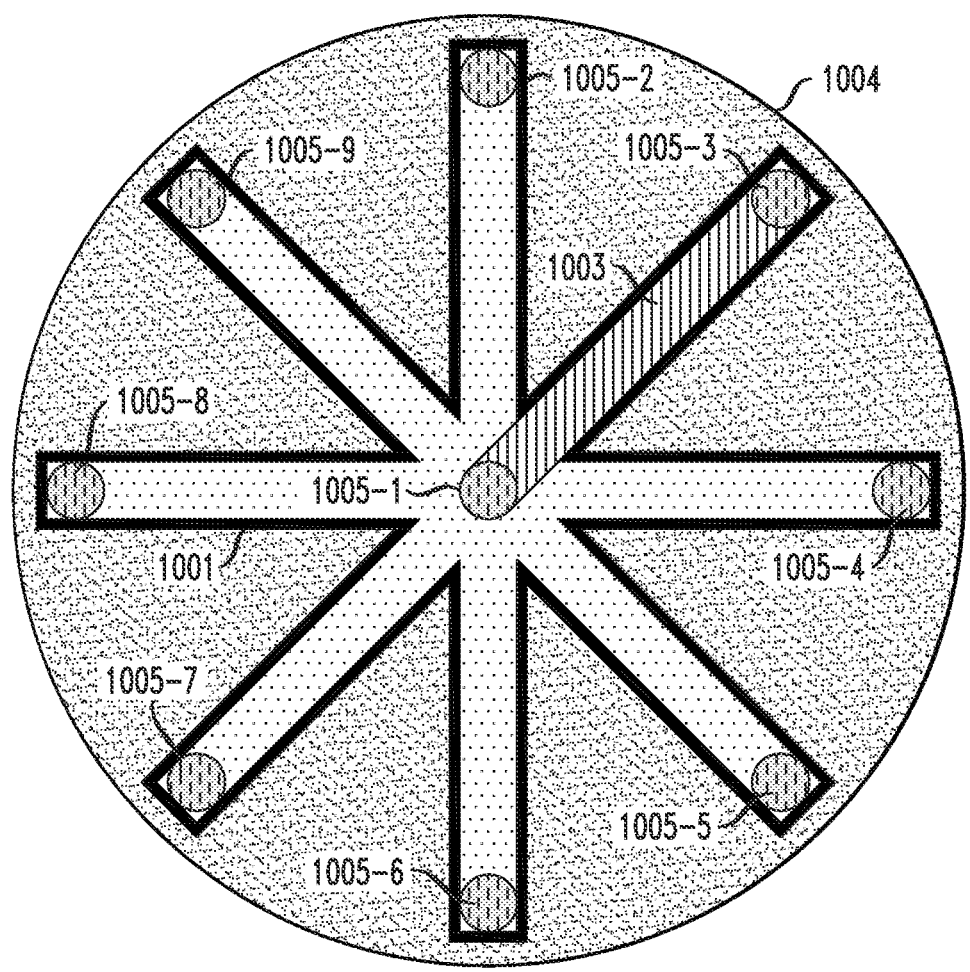
FIG. 10 depicts a top-down view of another electrically rotatable antenna, according to an embodiment of the invention.

FIG. 10 shows a top-down view 1000 of another electrically rotatable antenna, where instead of a full disk of PCM material, the PCM material 1001 is etched into a "star" pattern illustrated by the bold outline on a background of another material 1004 (e.g., a dielectric material). The bold outline shown in FIG. 10 provides predefined current paths, allowing the electrical current between the center ground electrode 1005-1 and the outer ring electrodes 1005-2 through 1005-9 to flow in defined pathways potentially reducing unwanted PCM filamentation effects. In the FIG. 10 example, a line of c-GST 1003 is formed by applying current between the outer ring electrode 1005-3 and the center ground electrode 1005-1 in the defined pathway of a-GST 1001 between the two. Again, while FIG. 10 illustrates an example where the "background" 1001 is a-GST and the line 1003 is c-GST, this is not a requirement. In other embodiments, the background 1001 may be c-GST and the line 1003 may be a-GST.

While various embodiments are described above with respect to forming patch or Babinet-style "V" antenna shape configurations, embodiments are not limited to use with these antenna shape configurations. In other embodiments, different electrode layouts and disk shape configurations may be used, or current may be applied between different combinations of the electrodes, to form various other antenna shape configurations. Such other antenna shape configurations include, but are not limited to, a split-ring resonator antenna shape configuration, horizontally or vertically oriented slot antenna shape configurations, etc.

In some embodiments, each of the electrically rotatable antennas in an array of electrically rotatable antennas providing a reconfigurable metasurface are the same (e.g., as shown in FIG. 7). In other embodiments, however, different ones of the electrically rotatable antennas in an array of electrically rotatable antennas providing a reconfigurable metasurface may be different. For example, different ones of the electrically rotatable antennas in the array may have different disk shapes, electrode layouts, optically tunable material, combinations thereof, etc.

In some embodiments, an apparatus comprises two or more electrically rotatable antennas providing a reconfigurable metasurface, each of the electrically rotatable antennas comprising a disk of optically tunable material. The apparatus also comprises a control circuit comprising a plurality of switches, each of the plurality of switches being coupled to (i) one of a plurality of electrodes, the plurality of electrodes being disposed proximate different portions of at least one surface of each of the disks of optically tunable material and (ii) to at least one of a current source and a ground voltage. The control circuit is configured to modify states of portions of the optically tunable material in each of the disks of optically tunable material utilizing current supplied between at least two of the plurality of electrodes to adjust reflectivity of said portions of the optically tunable material to dynamically reconfigure respective antenna shape configurations of each of the two or more electrically rotatable antennas.

The control circuit may be configured to modify the states of a given portion of the optically tunable material in a given one of the disks of optically tunable material of a given one of the electrically rotatable antennas between at least two different antenna shape configurations. The at least two different antenna shape configurations may comprise two or more different orientations of a given antenna shape configuration. The two or more different orientations of the given antenna shape configuration may comprise at least two of a horizontally oriented rectangular patch antenna shape configuration, a vertically oriented rectangular patch antenna shape configuration, and a diagonally oriented patch shape configuration. The two or more different orientations of the given antenna shape configuration may alternatively comprise a Babinet "V" shape antenna configuration at two or more angles.

The control circuit may be configured to modify the states of said portions of the optically tunable material in each of the disks of optically tunable material such that each of the two or more electrically rotatable antennas has a same antenna shape configuration but at different orientations relative to one another providing a reconfigurable geometric metasurface.

At least a given one of the disks of optically tunable material of at least a given one of the electrically rotatable antennas may comprise a circular disk.

At least a given one of the disks of optically tunable material in at least a given one of the electrically rotatable antennas may comprise chalcogenide PCM, and the control circuit may be configured to modify the state of a given portion of the given disk of optically tunable material by providing a current between two or more of the plurality of electrodes disposed proximate different portions of at least one surface of the given disk of optically tunable material to heat the chalcogenide PCM to change a phase of the chalcogenide PCM from one of crystalline and amorphous to the other one of crystalline and amorphous.

In some embodiments, a semiconductor structure comprises a substrate, a disk of optically tunable material disposed over the substrate, and a plurality of electrodes disposed proximate different portions of at least one surface of the disk of optically tunable material, each of the plurality of electrodes being coupled to a switch providing at least one of a current source and a ground voltage. The plurality of electrodes are configured to modify a state of at least a portion of the disk of optically tunable material to dynamically reconfigure an antenna shape configuration of an electrically rotatable antenna comprising the disk of optically tunable material.

The optically tunable material may comprise a chalcogenide PCM, and wherein the plurality of electrodes are configured to modify the state of the chalcogenide PCM via heating to change the chalcogenide PCM between an amorphous and a crystalline phase. The chalcogenide PCM may comprise at least one of $Ge_xSb_yTe_z$, $Ge_xTe_y$, $Sb_xTe_y$, $Ag_xSb_yTe_z$, and $Ag_wIn_xSb_yTe_z$. The optically tunable material may alternatively comprise an electrically tunable plasmonic material or a metal-insulator transition material.

The plurality of electrodes may comprise at least a first electrode disposed proximate a center of the at least one surface of the disk of optically tunable material and two or more electrodes disposed adjacent an outer edge surface of the disk of optically tunable material.

The semiconductor structure may further comprise a first dielectric layer disposed between the substrate and the disk of optically tunable material, a second dielectric layer disposed over the disk of optically tunable material, and a transparent conductor disposed over the second dielectric layer, wherein the plurality of electrodes comprise at least a first electrode disposed over the transparent conductor and two or more electrodes disposed adjacent an outer edge surface of the disk of optically tunable material. The semiconductor structure may further comprise a metal mirror disposed between the substrate and the first dielectric layer.

The semiconductor structure may further comprise a first dielectric layer disposed between the substrate and the disk of optically tunable material, a second dielectric layer disposed over the disk of optically tunable material, and a metal mirror disposed between the substrate and the first dielectric layer, wherein the plurality of electrodes comprise at least a first electrode embedded in the substrate and two or more electrodes disposed adjacent an outer edge surface of the disk of optically tunable material.

The plurality of electrodes may comprise at least a first electrode disposed over a top surface of the disk of optically tunable material and two or more electrodes disposed adjacent an outer edge surface of the disk of optically tunable material, and the semiconductor structure may further comprise a first dielectric layer disposed between the substrate and the disk of optically tunable material, a second dielectric layer disposed over the top surface of the disk of optically tunable material surrounding the first electrode, and a metal mirror disposed between the substrate and the first dielectric layer.

In some embodiments, a method comprises determining a desired interference effect for a reconfigurable metasurface comprising two or more electrically rotatable antennas, each of the two or more electrically rotatable antennas comprising a disk of optically tunable material and a plurality of switches each coupled to (i) one of a plurality of electrodes, the plurality of electrodes being disposed proximate different portions of at least one surface of each of the disks of optically tunable material and (ii) to at least one of a current source and a ground voltage. The method also comprises utilizing a control circuit to modify states of portions of the optically tunable material in each of the disks of optically tunable material utilizing current supplied between at least two of the plurality of electrodes to adjust reflectivity of said portions of the optically tunable material to dynamically reconfigure respective antenna shape configurations of each of the two or more electrically rotatable antennas to provide the desired interference effect.

At least a given one of the disks optically tunable material in at least a given one of the two or more electrically rotatable antennas may comprise chalcogenide PCM, and utilizing the control circuit to modify the state of a given portion of the given disk of optically tunable material may comprise providing a current between two or more of the plurality of electrodes disposed proximate the given disk of optically tunable material to heat the chalcogenide PCM to change a phase of the chalcogenide PCM from one of crystalline and amorphous to the other one of crystalline and amorphous.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a substrate;
   a disk of optically tunable material disposed over the substrate; and
   a plurality of electrodes disposed proximate different portions of the disk of optically tunable material, each of the plurality of electrodes being coupled to a switch providing at least one of a current source and a ground voltage;
   wherein the plurality of electrodes are configured to modify a state of at least a portion of the disk of optically tunable material to dynamically reconfigure an antenna shape configuration of an electrically rotatable antenna comprising the disk of optically tunable material; and
   wherein the plurality of electrodes comprise two or more electrodes disposed adjacent an outer edge lateral surface of the disk of optically tunable material.

2. The semiconductor structure of claim 1, wherein the optically tunable material comprises a chalcogenide phase-change material, and wherein the plurality of electrodes are configured to modify the state of the chalcogenide phase-change material via heating to change the chalcogenide phase-change material between an amorphous and a crystalline phase.

3. The semiconductor structure of claim 2, wherein the chalcogenide phase-change material comprises at least one of germanium antinomy telluride, germanium telluride, antimony telluride and silver antimony telluride.

4. The semiconductor structure of claim 1, wherein the optically tunable material comprises an electrically tunable plasmonic material.

5. The semiconductor structure of claim 1, wherein the optically tunable material comprises a metal-insulator transition material.

6. The semiconductor structure of claim 1, wherein the plurality of electrodes comprises at least a first electrode disposed proximate a center of a top surface of the disk of optically tunable material and the two or more electrodes disposed adjacent the outer edge lateral surface of the disk of optically tunable material.

7. The semiconductor structure of claim 1, further comprising:
 a first dielectric layer disposed between the substrate and the disk of optically tunable material;
 a second dielectric layer disposed over the disk of optically tunable material; and
 a transparent conductor disposed over the second dielectric layer;
 wherein the plurality of electrodes comprise at least a first electrode disposed over the transparent conductor and the two or more electrodes disposed adjacent the outer edge lateral surface of the disk of optically tunable material.

8. The semiconductor structure of claim 7, further comprising a metal mirror disposed between the substrate and the first dielectric layer.

9. The semiconductor structure of claim 1, further comprising:
 a first dielectric layer disposed between the substrate and the disk of optically tunable material;
 a second dielectric layer disposed over the disk of optically tunable material; and
 a metal mirror disposed between the substrate and the first dielectric layer;
 wherein the plurality of electrodes comprise at least a first electrode embedded in the substrate and the two or more electrodes disposed adjacent the outer edge lateral surface of the disk of optically tunable material.

10. The semiconductor structure of claim 1, wherein the plurality of electrodes comprise at least a first electrode disposed over a top surface of the disk of optically tunable material and the two or more electrodes disposed adjacent the outer edge lateral surface of the disk of optically tunable material, and further comprising:
 a first dielectric layer disposed between the substrate and the disk of optically tunable material;
 a second dielectric layer disposed over the top surface of the disk of optically tunable material surrounding the first electrode; and
 a metal mirror disposed between the substrate and the first dielectric layer.

11. The semiconductor structure of claim 1, wherein at least one of the two or more electrodes disposed adjacent the outer edge lateral surface of the disk of optically tunable material is further disposed adjacent a portion of a top surface of the disk optically tunable material.

12. The semiconductor structure of claim 1, wherein first and second ones of the two or more electrodes disposed adjacent the outer edge lateral surface of the disk of optically tunable material are further disposed adjacent respective first and second portions of the top surface of the disk of optically tunable material.

13. The semiconductor structure of claim 1, wherein the two or more electrodes disposed adjacent the outer edge lateral surface of the disk of optically tunable material are uniformly spaced around the outer edge lateral surface of the disk of optically tunable material.

14. The semiconductor structure of claim 1, wherein at least first and second ones of the two or more electrodes disposed adjacent the outer edge lateral surface of the disk of optically tunable material are non-uniformly spaced around the outer edge lateral surface of the disk of optically tunable material.

15. The semiconductor structure of claim 1, wherein the two or more electrodes disposed adjacent the outer edge lateral surface of the disk of optically tunable material comprise at least eight electrodes disposed adjacent the outer edge lateral surface of the disk of optically tunable material.

16. The semiconductor structure of claim 1, wherein the plurality of electrodes further comprises at least one electrode disposed proximate a center of a top surface of the disk of optically tunable material, and wherein the plurality of electrodes are configured to modify the state of two or more portions of the disk of optically tunable material disposed between the center of the top surface of the disk of optically tunable material and the two or more electrodes disposed adjacent the outer edge lateral surface of the disk of optically tunable material.

17. The semiconductor structure of claim 16, wherein the two or more portions of the disk of optically tunable material comprise two or more line segments connecting the center of the top surface of the disk of optically tunable material with two or more points on the outer edge lateral surface of the disk of optically tunable material where the two or more electrodes disposed adjacent the outer edge lateral surface of the disk of optically tunable material are located.

18. The semiconductor structure of claim 1, wherein the plurality of electrodes are configured to modify the state of at least one portion of the disk of optically tunable material disposed between the two or more electrodes disposed adjacent the outer edge lateral surface of the disk of optically tunable material.

19. The semiconductor structure of claim 18, wherein said at least one portion of the disk of optically tunable material comprises a line segment connecting two or more points on the outer edge lateral surface of the disk of optically tunable material where two of the two or more electrodes disposed adjacent the outer edge lateral surface of the disk of optically tunable material are located.

20. The semiconductor structure of claim 1, wherein the disk of optically tunable material comprises optically tunable material etched into a pattern on a background of a dielectric material, the pattern defining current pathways between the two or more electrodes disposed adjacent the outer edge lateral surface of the disk of optically tunable material and one or more other ones of the plurality of electrodes.

* * * * *